(12) United States Patent
Amemiya et al.

(10) Patent No.: US 7,267,551 B2
(45) Date of Patent: Sep. 11, 2007

(54) INSPECTION CONTACT STRUCTURE AND PROBE CARD

(75) Inventors: Takashi Amemiya, Hyogo (JP); Shuichi Tsukada, Hyogo (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 11/270,444

(22) Filed: Nov. 10, 2005

(65) Prior Publication Data

US 2006/0154497 A1    Jul. 13, 2006

(30) Foreign Application Priority Data

Jan. 11, 2005    (JP) ............... 2005-004016

(51) Int. Cl.
*H01R 12/00* (2006.01)
(52) U.S. Cl. .................. 439/66; 439/91
(58) Field of Classification Search .......... 439/66, 439/91, 86, 591
See application file for complete search history.

(56) References Cited

U.S. PATENT DOCUMENTS

| | | | |
|---|---|---|---|
| 6,590,381 B1 | 7/2003 | Iino et al. | |
| 6,790,057 B2* | 9/2004 | DelPrete et al. | 439/91 |
| 2001/0053170 A1 | 12/2001 | Ohtaki | |
| 2002/0030501 A1 | 3/2002 | Ohtaki | |
| 2003/0076128 A1 | 4/2003 | Ohtaki | |
| 2005/0064740 A1* | 3/2005 | Brodsky et al. | 439/66 |
| 2005/0164526 A1* | 7/2005 | Kwark | 439/66 |
| 2005/0208788 A1* | 9/2005 | Dittmann | 439/66 |
| 2006/0121750 A1* | 6/2006 | Beurskens | 439/66 |
| 2006/0128176 A1* | 6/2006 | Johnson | 439/66 |
| 2006/0141815 A1* | 6/2006 | Li | 439/66 |
| 2006/0172564 A1* | 8/2006 | Nilsson et al. | 439/66 |

FOREIGN PATENT DOCUMENTS

| | | |
|---|---|---|
| JP | 03-196416 | 8/1991 |
| JP | 11-273772 | 10/1999 |
| JP | 2000-156119 | 6/2000 |
| JP | 2000-258495 | 9/2000 |
| JP | 2000-286313 | 10/2000 |
| JP | 2001-85477 | 3/2001 |
| JP | 2002-151184 | 5/2002 |
| JP | 2004-227828 | 8/2004 |
| WO | WO 00/45433 | 8/2000 |

OTHER PUBLICATIONS

Japanese Office Action dated Aug. 15, 2006.

\* cited by examiner

*Primary Examiner*—Hien Vu
(74) *Attorney, Agent, or Firm*—Finnegan, Henderson, Farabow, Garrett & Dunner, L.L.P.

(57) ABSTRACT

In the present invention, an inspection contact structure is attached to the lower surface side of a circuit board in a probe card. In the inspection contact structure, elastic sheets with protruding conductive portions are respectively attached to both surfaces of a silicone substrate. The silicone substrate is formed with current-carrying paths passing therethrough in the vertical direction, and the sheet conductive portions are in contact with the current-carrying paths from above and below. The conductive portions on the upper side are in contact with connecting terminals of the circuit board. At the time of inspection of electric properties of a wafer, electrode pads on the wafer are pressed against the conductive portions on the lower side and thereby brought into contact with them.

8 Claims, 5 Drawing Sheets

INSPECTION CONTACT STRUCTURE AND PROBE CARD

BACKGROUND OF THE INVENTION

1. Field of the Invention

The present invention relates to an inspection contact structure to contact with an object electrically to be inspected to inspect electric properties of the object to be inspected, and a probe card.

2. Description of the Related Art

Inspection of electric properties of an electronic circuit such as an IC, LSI, or the like formed, for example, on a semiconductor wafer is performed by bringing, for example, a plurality of probe needles arranged on the lower surface of a probe card into electrical contact with electrode pads of the electronic circuit on the wafer. Therefore, the probe needles need to be arranged in alignment with the positions of the respective electrode pads.

However, the pattern of the electronic circuit has become finer in which the electrode pads have been made finer and intervals between the electrode pads have become smaller. This requires formation of fine contact portions at a narrow pitch, such as those with a width dimension of 100 µm or less and at a pitch of 180 µm or less. Hence, use of an anisotropic conductive sheet instead of the probe needles is proposed (Japanese Patent Application Laid-open Publication No. H03-196416 (U.S. Pat. No. 3,038,859). The anisotropic conductive sheet is a sheet having a plurality of elastic conductive portions protruding from one surface of the sheet being an insulating portion, in which the conductive portions can be formed very fine at a narrow pitch.

However, when the above-described anisotropic conductive sheet is simply used, the conductive portions have limitations in dimension in the height direction because the conductive portions are formed fine at a narrow pitch, resulting in small displacement in the height direction presented by the elasticity of the conductive portions. As a result, the conductive portions cannot absorb, by their elasticity, variations in height of a number of electrode pads on the wafer surface, thus causing unstable contact between the conductive portions and the electrode pads within the wafer surface. Further, the inclination and distortion on the probe card side occurring due to attachment or thermal expansion of the probe card cannot be sufficiently absorbed by the elasticity of the conductive portions, resulting in unstable contact of the electrode pads within the wafer surface.

SUMMARY OF THE INVENTION

The present invention has been developed in consideration of the above points and its object is to provide an inspection contact structure and a probe card in which contact portions to an object to be inspected such as a wafer can be made very fine at a narrow pitch, and contact with the object to be inspected can be stable.

To achieve the above object, the present invention is an inspection contact structure to contact with an object electrically to be inspected to inspect electric properties of the object to be inspected, the inspection contact structure including: a substrate in a flat plate shape; and sheets respectively attached to both surfaces of the substrate, each of the sheets including a plurality of elastic conductive portions and insulating portions each interconnecting the conductive portions. The conductive portions are formed to pass through the sheet and protrude from both surfaces of the sheet, and the substrate is formed with a plurality of current-carrying paths linearly passing through the substrate in a thickness direction in a manner to correspond to the conductive portions. The conductive portions of the sheets on both surfaces of the substrate are in contact with end portions of the respective corresponding current-carrying paths in a manner to have the current-carrying paths sandwiched therebetween.

According to the present invention, a sheet is used which is formed with a number of conductive portions within the sheet surface, so that very fine contact portions at a narrow pitch can be realized. Since the sheets are respectively attached to both surfaces of the substrate, the conductive portions of the sheet on the side of the object to be inspected come into contact with the object to be inspected, so that the elasticity of the conductive portions can absorb variations in height of the object to be inspected. Further, the conductive portions of the sheet on the side opposite to the object to be inspected come into contact with, for example, connecting terminals on the circuit board on the probe card side to which an electrical signal for inspection is applied, so that the elasticity of the conductive portions can absorb distortion and inclination of the whole probe card or the circuit board. Accordingly, even though the contact portions are fine at a narrow pitch, contact with the object to be inspected is stable and the inspection of the electric properties is appropriately performed.

The conductive portions of the sheets on both surface of the substrate and the current-carrying paths in the substrate may be arranged on same axes. In this case, when the object to be inspected is pressed against and brought into contact with the conductive portions of one of the sheets, force acts on the substrate on the same axes passing from the conductive portions on both surfaces through current-carrying paths. Therefore, only opposing couple force in the thickness direction but no moment can act, thereby preventing breakage of the substrate. The effect is significantly presented particularly when using a very thin substrate with a thickness of 1 mm or less.

The sheet may be fixed to a frame formed along an outer peripheral portion of the sheet and fixed to the substrate via the frame. In this case, the deflection and distortion of the sheet itself can be suppressed so that the sheet can be made to follow the surface of the substrate. As a result of this, uniform contact can be realized by the conductive portions within the sheet surface.

The frame may be bonded to the substrate with a silicone adhesive. In this case, the frame can be relatively easily detached from the substrate, thus allowing replacement and maintenance of the sheet to be easily performed.

Tapered contactors that come into contact with the object to be inspected may be attached to tip portions of the conductive portions of the sheet located on the side of the object to be inspected. In this case, the contact pressure to the object to be inspected increases, whereby the electrical contact with the object to be inspected can be more stable. Further, since the conductive portions never come into direct contact with the object to be inspected, wear of the conductive portions can be prevented.

The present invention according to another aspect is a probe card for inspecting electric properties of an object to be inspected, the card including: a circuit board; and an inspection contact structure provided between the circuit board and the object to be inspected, for passing current between the object to be inspected and the circuit board. The inspection contact structure includes: a substrate in a flat plate shape; and sheets respectively attached to both surfaces of the substrate, each of the sheets composed of a plurality of elastic conductive portions and insulating portions each interconnecting the conductive portions. The conductive portions are formed to pass through the sheet and protrude from both surfaces of the sheet, and the substrate is formed with a plurality of current-carrying paths linearly passing through the substrate in a thickness direction in a manner to correspond to the conductive portions. The conductive portions of the sheets on both surfaces of the substrate are in contact with end portions of the respective corresponding current-carrying paths in a manner to have the current-carrying paths sandwiched therebetween, and the inspection contact structure is configured to be freely attached to/detached from the circuit board.

In this case, the above-described inspection contact structure is freely attached to/detached from the circuit board, so that the inspection contact structure can be detached to allow, for example, maintenance of the inspection contact structure such as replacement of the sheet to be easily performed.

The inspection contact structure may be bonded to the circuit board with a silicone adhesive. In this case, the inspection contact structure can be easily detached from the circuit board.

Further, the circuit board may be formed with suction ports for sucking the substrate of the inspection contact structure. In this case, stop of the suction through the suction ports allows the inspection contact structure to be freely attached to/detached from the circuit board.

According to the present invention, inspection of the electric properties of the object to be inspected can be stably performed, so that defects in electronic devices can be surely detected to improve their quality.

DETAILED DESCRIPTION OF THE INVENTION

Figure 1:
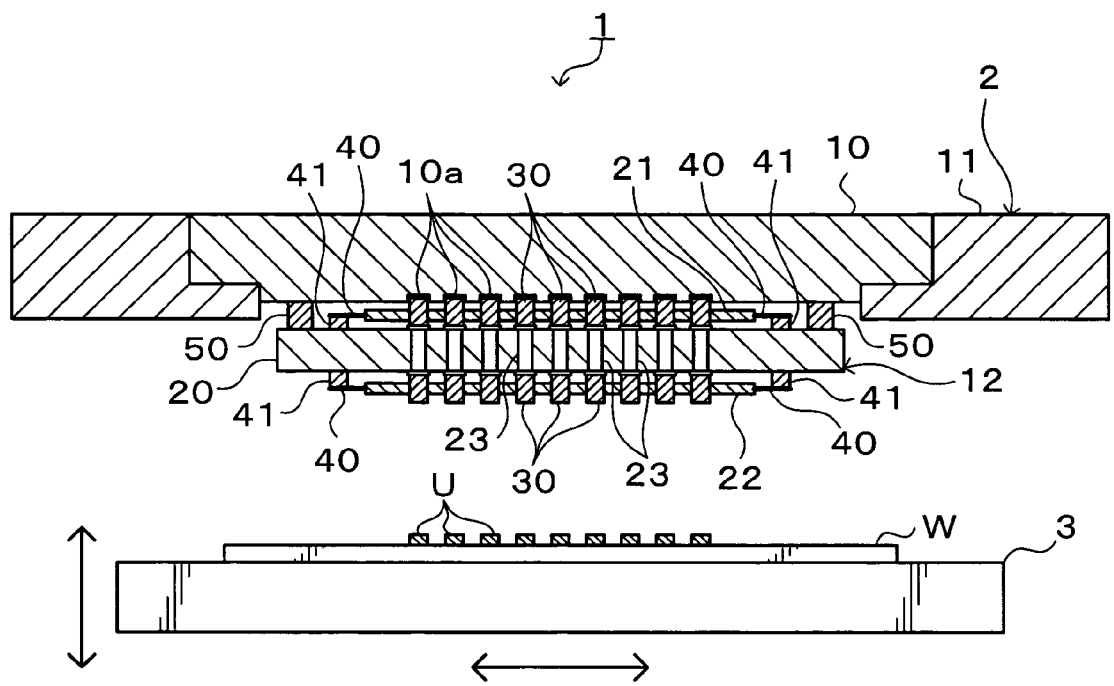
FIG. 1 is an explanatory view of a longitudinal section showing a schematic configuration of a probe device.

Hereinafter, a preferred embodiment of the present invention will be described. FIG. 1 is an explanatory view of a longitudinal section showing a schematic configuration of the inside of a probe device 1 in which an inspection contact structure according to this embodiment is used.

In the probe device 1, for example, a probe card 2 and a mounting table 3 on which a wafer W as an object to be inspected is mounted are provided. The probe card 2 includes a circuit board 10 for transmitting an electrical signal to electrode pads U on the wafer W on the mounting table 3; a holder 11 for holding the outer peripheral portion of the circuit board 10; and an inspection contact structure 12 attached to the circuit board 10 on the wafer W side which comes into contact with the electrode pads U on the wafer W to pass current between the circuit board 10 and the electrode pads U.

The circuit board 10 is formed, for example, in a substantially disk shape. On a lower surface of the circuit board 10, a plurality of terminals 10a for conducting the circuit board 10 with the inspection contact structure 12.

The inspection contact structure 12 includes a silicone substrate 20, for example, in a shape of a flat plate; a first sheet 21 attached to the upper surface of the silicone substrate 20; and a second sheet 22 attached to the lower surface of the silicone substrate 20.

Figure 2:
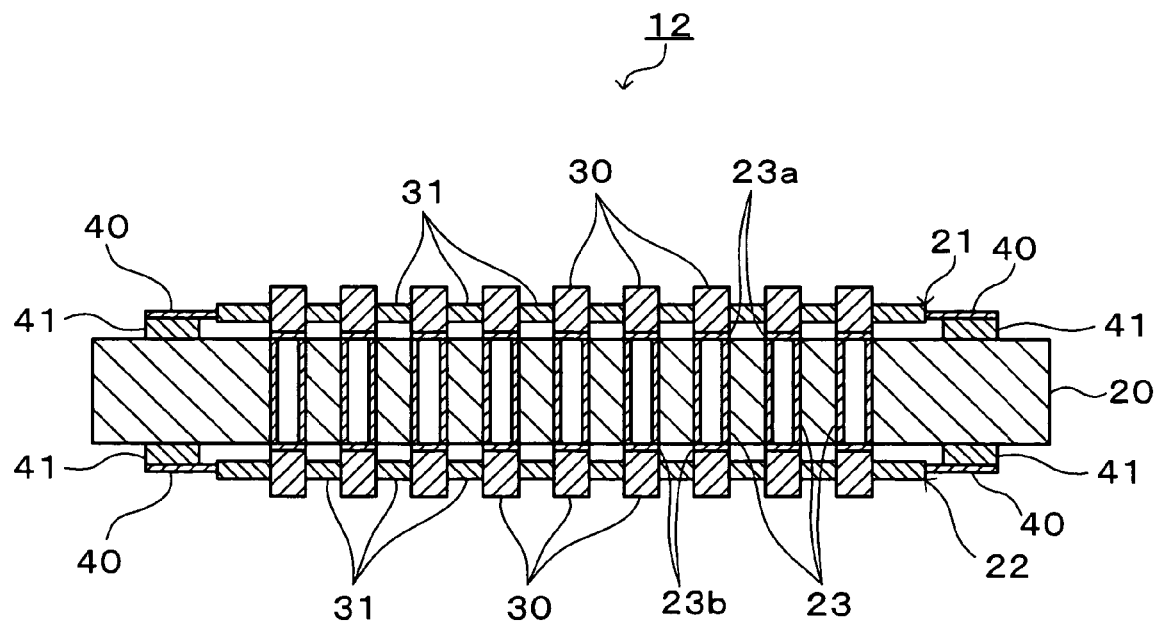
FIG. 2 is an explanatory view of a longitudinal section showing a configuration of an inspection contact structure.

The silicone substrate 20 is formed in a shape of a square flat plate that is thin, for example, about 200 µm to about 400 µm. The silicone substrate 20 is formed with a plurality of current-carrying paths 23 which vertically pass through the silicone substrate 20 from its upper surface to its lower surface as shown in FIG. 2. The current-carrying paths 23 are formed such that they correspond one-to-one with the plurality of electrode pads U on the wafer W. Upper connecting terminals 23a are formed at the top end portions of the current-carrying paths 23, while lower connecting terminals 23b are formed at the bottom end portions of the current-carrying paths 23. Note that processing of the silicone substrate 20 is performed by etching process through use of the photolithography technique.

Figure 3:
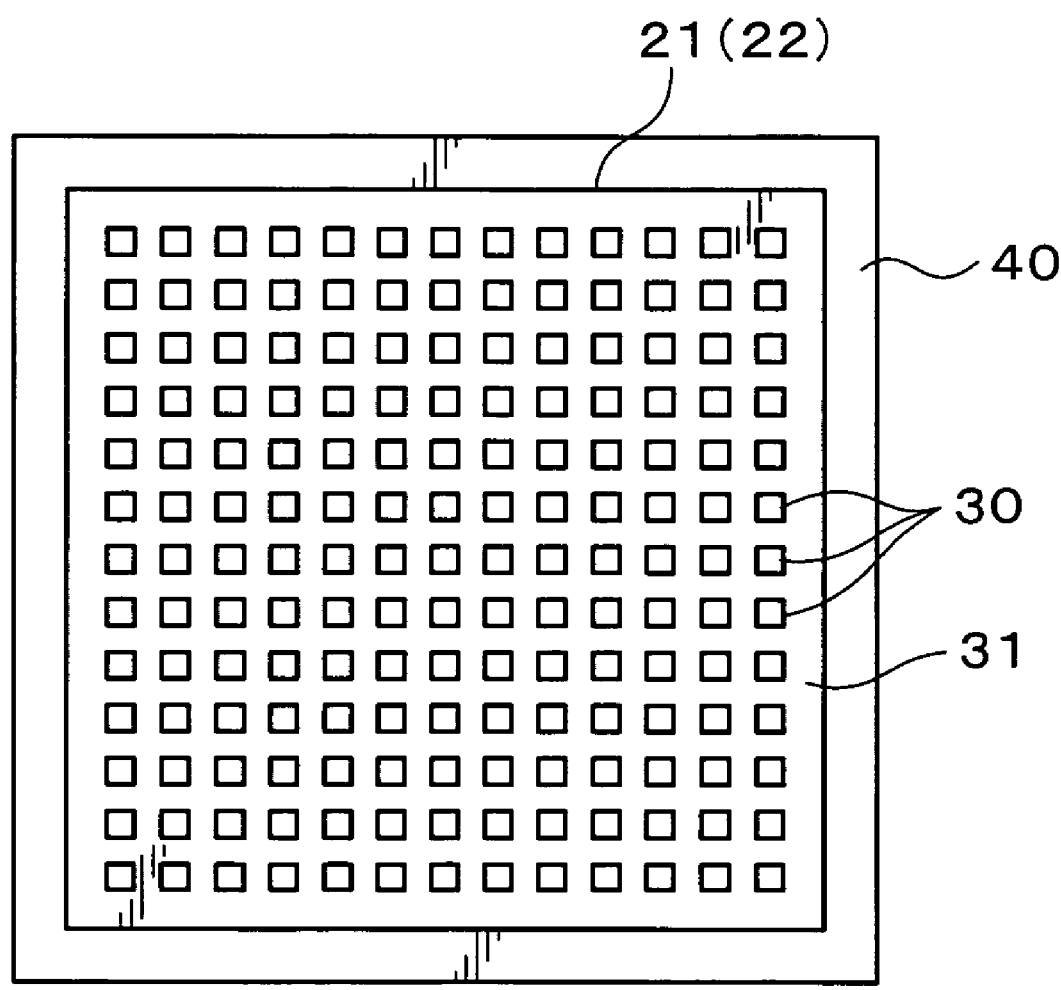
FIG. 3 is a plan view of a sheet.
Figure 4:
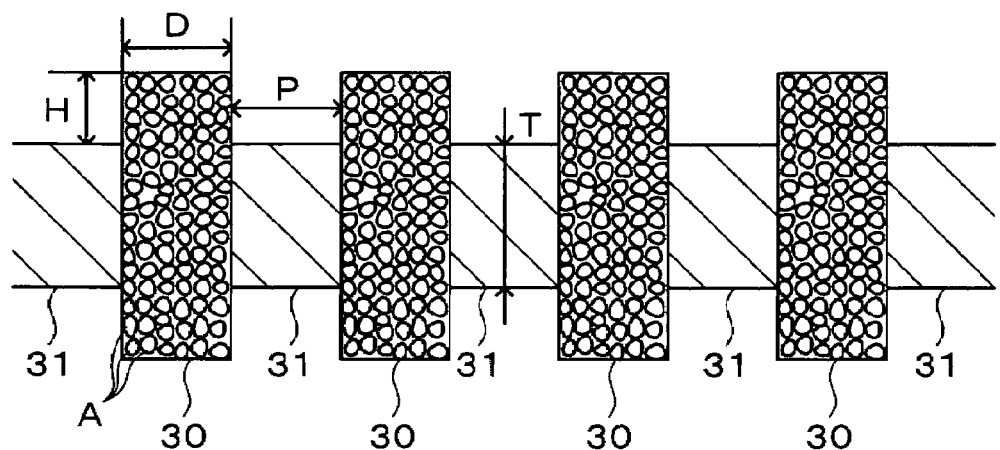
FIG. 4 is an explanatory view of a structure of the sheet.
Figure 5:
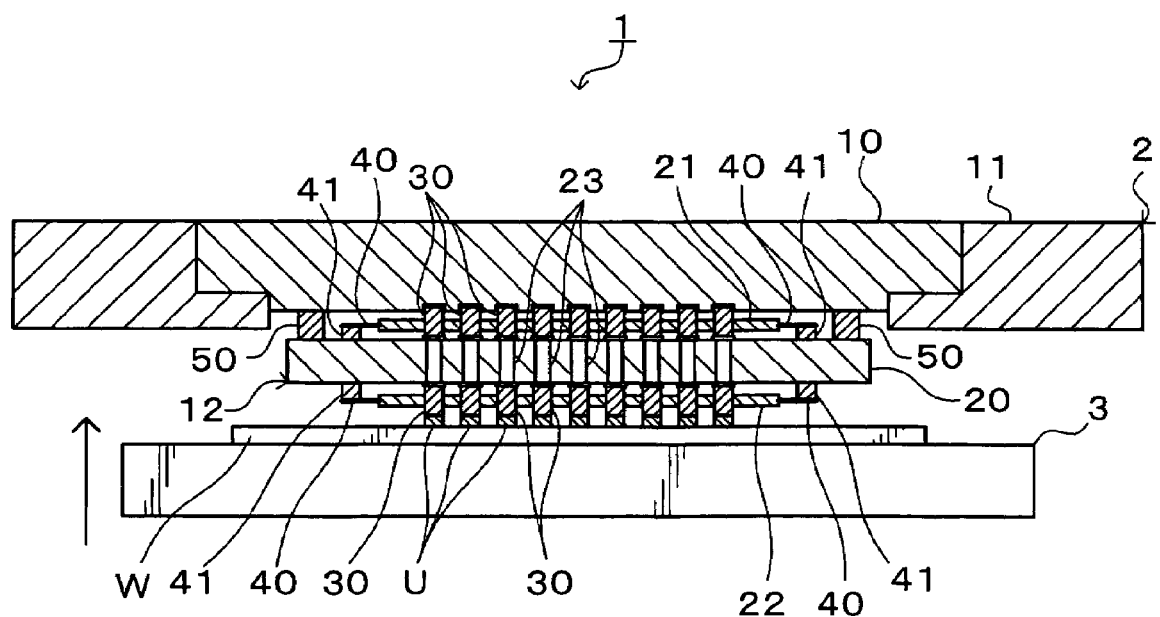
FIG. 5 is an explanatory view of a longitudinal section of the probe device showing a state in which conductive portions are in contact with electrode pads.

Each of the first sheet 21 and the second sheet 22 is an elastic rubber sheet having, for example, a square shape as a whole as shown in FIG. 3, and is composed of a plurality of conductive portions 30 densely arranged within the sheet surface and insulating portions 31 each connecting the conductive portions 30. The plurality of conductive portions 30 are placed at positions to correspond one-to-one with the electrode pads U on the wafer W and the current-carrying paths 23 of the silicone substrate 20 as shown in FIG. 2. The insulating portions 31 are formed of, for example, a polymeric substance having insulation performance and elasticity. Each of the conductive portions 30 is formed such that, for example, conductive particles A are densely filled in a polymeric substance having insulation performance and elasticity as shown in FIG. 4. The conductive portion 30 is formed in a shape of a square pole passing through the sheet and protruding from both surfaces of the sheet. According to the above configuration, the conductive portions 30 have conductivity in a pressed state and have elasticity in a direction of protrusion from both surfaces of the sheet. For example, the thickness T of the insulating portion 31 is set to, for example, about 100 µm, and the conductive portion 30 is formed such that its height H from the sheet surface is about 30 µm that is 0.3 times the thickness of the insulating portion 31. The conductive portion 30 is formed such that its width D is, for example, about 85 µm, and the pitch P between adjacent conductive portions 30 is set to about 180 µm.

As shown in FIG. 3, the outer peripheral portion of each of the first sheet 21 and the second sheet 22 is fixed to, for example, a metal frame 40. The metal frame 40 has a frame shape along the outer peripheral portion of the sheet 21 or 22. As shown in FIG. 2, supporting portions 41 composed of a silicone adhesive are formed on both surfaces of the outer peripheral portion of the silicone substrate 20. The metal frame 40 of the first sheet 21 is fixed to the supporting portion 41 on the upper surface of the silicone substrate 20. The metal frame 40 of the second sheet 22 is fixed to the supporting portion 41 on the lower surface of the silicone substrate 20. The height of the supporting portion 41 is adjusted so that the conductive portions 30 of the sheet 21 or 22 come into contact with the connecting terminals on the current-carrying paths 23 of the silicone substrate 20 in the pressed state. In other words, the conductive portions 30 of the first sheet 21 abut the corresponding upper connecting terminals 23a with the first sheet 21 being fixed to the upper surface side of the silicone substrate 20. The conductive portions 30 of the second sheet 22 abut the corresponding lower connecting terminals 23b with the second sheet 22 being fixed to the lower surface side of the silicone substrate 20. Accordingly, the conductive portions 30 of the first sheet 21, the conductive portions 30 of the second sheet 22, and the current-carrying paths 23 are connected on the same axes in the vertical direction.

As shown in FIG. 1, the silicone substrate 20 is supported on the lower surface of the circuit board 10 by a supporter 50 placed at a position outside the supporting portion 40 on the upper surface of the silicone substrate 20. The supporter 50 is composed of, for example, a silicone adhesive. The height of the supporter 50 is adjusted so that the top end surfaces of the conductive portions 30 of the first sheet 21 come into contact with the connecting terminals 10a of the circuit board 10 in a pressed state.

The mounting table 3 is configured to be movable, for example, laterally and vertically to be able to move the wafer W mounted thereon in three-dimensional directions.

In the probe device 1 configured as described above, the wafer W is mounted at a predetermined position on the mounting table 3, and the mounting table 3 subsequently moves so that the electrode pads U on the wafer W come into contact with the corresponding conductive portions 30 of the second sheet 22. An electrical signal for inspection is then supplied from the circuit board 10 to the electrode pads U through the conductive portions 30 of the first sheet 21, the current-carrying paths 23, and the conductive portions 30 of the second sheet 22 in the inspection contact structure 12 in order, to inspect electric properties of a circuit on the wafer W.

In the probe device 1 described in the above embodiment, the sheets 21 and 22 are respectively placed on both surfaces of the silicone substrate 20 and the conductive portions 30 of the second sheet 22 are brought into contact with the electrode pads U on the wafer W, so that fine contact portions of 100 μm or less at a pitch of 180 μm or less can be realized. Even though such fine contact portions at a narrow pitch are realized, the conductive portions 30 of the second sheet 22 on the lower surface side of the silicone substrate 20, for example, can absorb variations in height of the electrode pads U on the wafer W through use of elasticity of the conductive portions 30. Further, the conductive portions 30 of the first sheet 21 on the upper surface side of the silicone substrate 20 can absorb distortion and inclination of the circuit board 10 through use of the elasticity of the conductive portions 30 so that the horizontality of the inspection contact structure 12 is maintained. This ensures stable contact between the electrode pads U within the wafer surface and the conductive portions 30 of the probe card 2 so that the inspection within the wafer surface can be appropriately performed.

When the electrode pads U on the wafer W are pressed against the conductive portions 30, only an opposing stress in the thickness direction and no deflection moment act on the silicone substrate 20, since the conductive portions 30 of the first sheet 21 and the second sheet 22 and the current-carrying paths 23 in the silicone substrate 20 are arranged on a straight line in the vertical direction, resulting in prevention of breakage of the very thin silicone substrate 20.

Since the outer peripheral portions of the first sheet 21 and the second sheet 22 are fixed to the metal frames 40 and the metal frames 40 are attached to the supporting portions 41 on the silicone substrate 20, the sheets 21 and 22 can be made to follow the surfaces of the silicone substrate 20, while distortion and deflection of the sheets 21 and 22 themselves are prevented. As a result, the contact of the conductive portions 30 within the sheets 21 and 22 can be made uniformly.

Since the metal frames 40 of the first sheet 21 and the second sheet 22 are fixed to the silicone substrate 20 with a silicone adhesive, the first sheet 21 and the second sheet 22 can be easily detached from the silicone substrate 20. Therefore, maintenance and replacement of the first sheet 21 and the second sheet 22 can be easily performed.

Further, since the silicone substrate 20 is fixed to the circuit board 10 with a silicone adhesive, the inspection contact structure 12 is attachable to/detachable from the circuit board 10 so that the inspection contact structure 12 can be easily detached from the circuit board 10. As a result of this, maintenance and replacement of the inspection contact structure 12 can be easily performed.

Figure 6:
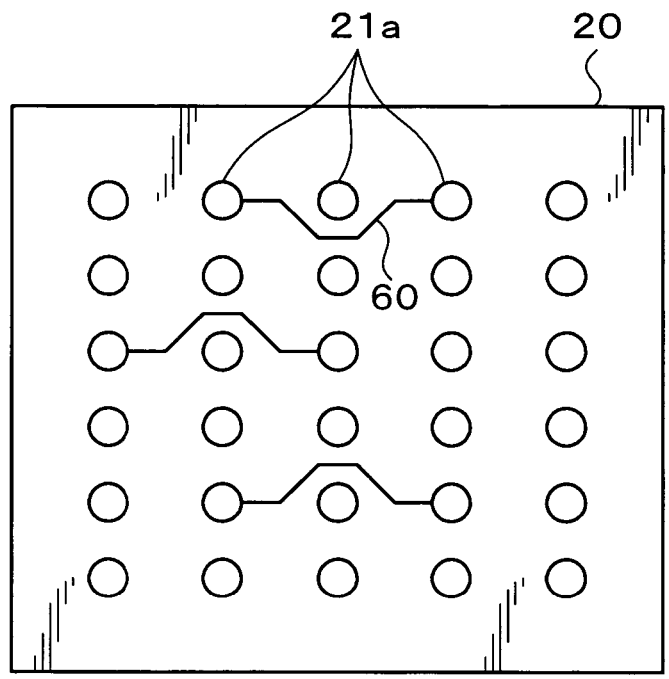
FIG. 6 is a plan view of a silicone substrate where a wiring pattern is formed on its upper surface.
Figure 7:
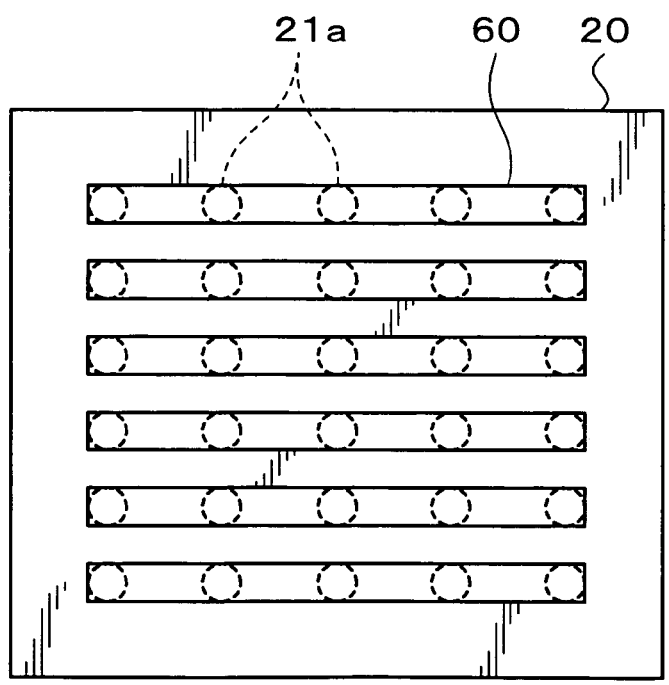
FIG. 7 is a plan view of a silicone substrate where a wiring pattern is formed on its upper surface.
Figure 8:
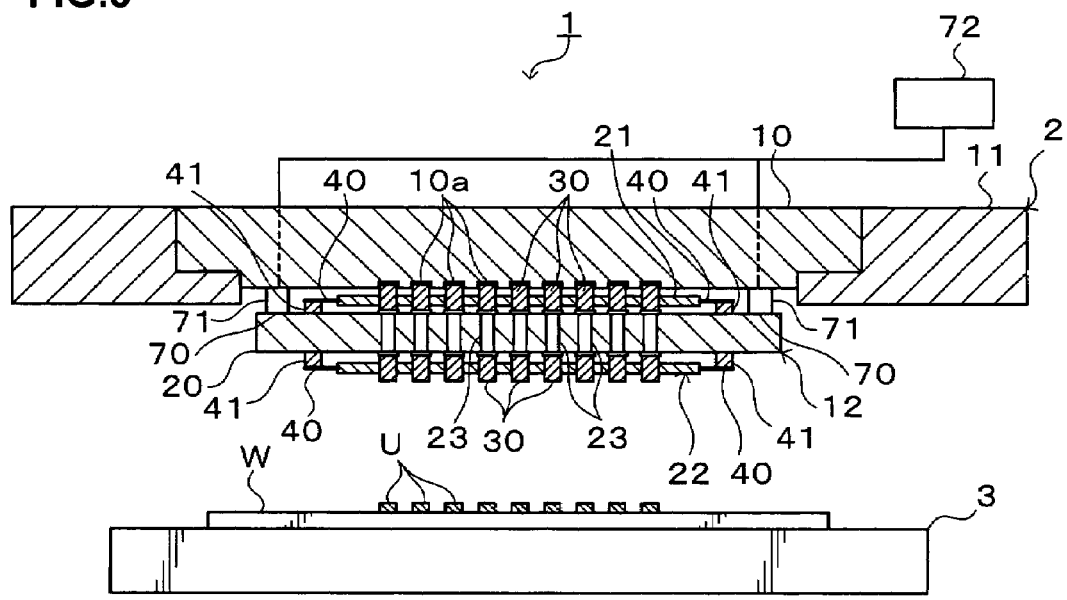
FIG. 8 is an explanatory view of a longitudinal section of a probe device including piping having suction ports.

In the above embodiment, since the silicone substrate 20 is used as the substrate to which the sheets 21 and 22 are fixed, a predetermined wiring pattern in which predetermined connecting terminals are connected using metal wires can be formed, for example, on at least any of the upper surface and the lower surface of the silicone substrate 20 by the photolithography technology. For example, particular upper connecting terminals 23a may be connected using metal wires 60 on the upper surface of the silicone substrate 20 as shown in FIG. 6, or the upper connecting terminals 23a on straight lines in a predetermined direction may be connected using metal wires 60 to form parallel connection lines as shown in FIG. 7. In this case, the plurality of conductive portions 30 whose upper connecting terminals 23a are connected can be used for inspection of, for example, the same electrode depending on the pattern of the electronic circuit on the wafer W. In this case, since inspection of one electrode is performed using the plurality of conductive portions 30, the inspection is performed with more reliability. Further, the connecting wiring pattern of the upper connecting terminals 23a on the silicone substrate 20 can be created depending on the pattern of the electronic circuit, thus making it possible to form the wiring pattern more easily than change of the wiring pattern within the circuit board 10 and to appropriately cope with every pattern of the electronic circuit. Note that a wiring pattern may be formed in which particular lower connecting terminals 23b are connected on the lower surface of the silicone substrate 20.

It should be noted that the silicone substrate 20 may be fixed to the circuit board 10 by suction. In this case, the lower surface of the circuit board 10 is provided with pipe paths 71 with suction ports 70 open at their bottom ends. For example, the pipe paths 71 pass through the circuit board 10 of the probe card 2 and are connected to a negative pressure generating device 72 located, for example, outside the probe card 2. To attach the inspection contact structure 12 to the circuit board 10, the negative pressure generating device 72 sucks via the suction ports 70 so that the suction force fixes the silicone substrate 20 to the circuit board 10. To detach the inspection contact structure 12 from the circuit board 10, the suction by the negative pressure generating device 72 is stopped. In this case, detachment of the inspection contact structure 12 from the circuit board 10 can be easily performed. The inspection contact structure 12 may be attached to/detached from the circuit board 10 by another way, for example, by using magnetic force.

When the inspection contact structure 12 is configured to be freely attached to/detached from the circuit board 10 as described above, the inspection contact structure 12 can be easily detached from the probe card 2 and replaced with another. In addition, the conductive portions 30 of the first sheet 21 can absorb distortion and inclination of the circuit board 10 through use of elasticity of the conductive portions 30 as has been described, so that stable contact state can be achieved even if the circuit board 10 has deflection and so on. Accordingly, replacement of the inspection contact structure 12 can be performed without fine adjustment even in an ordinary work environment away from a prober. Further, since the inspection contact structure 12 is fixed at its silicone substrate 20 to the probe card 2 (directly to the circuit board 10), contactors (the conductive portions 30 in this embodiment) which come into direct contact with the wafer W can be formed on a desired plane. In short, the inspection contact structure 12 can be made parallel to the probe card 2 without fine adjustment.

Figure 9:
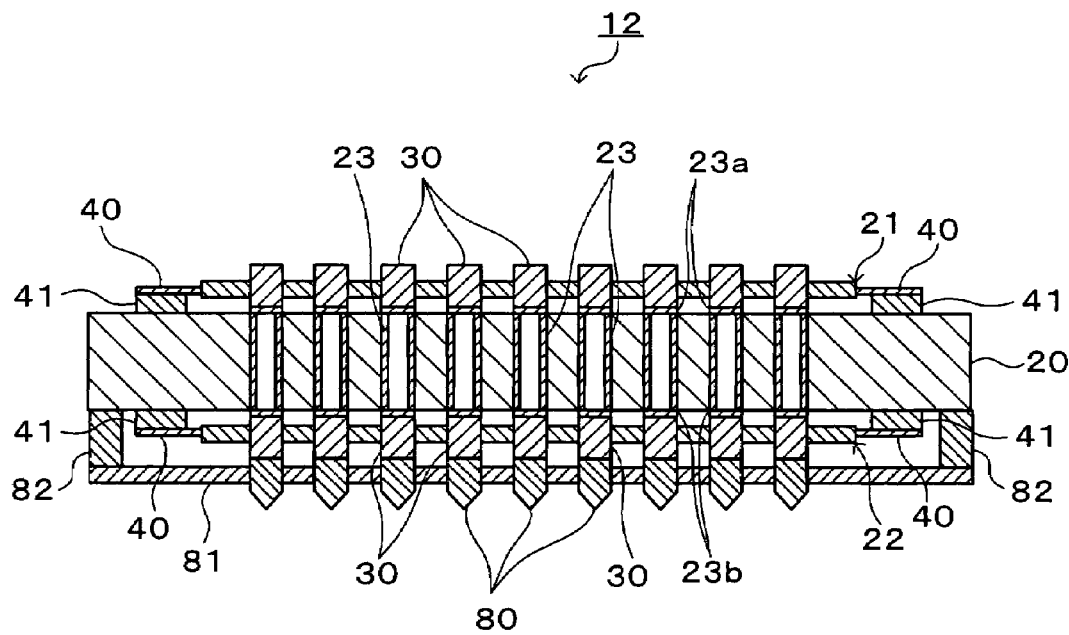
FIG. 9 is an explanatory view of a longitudinal section of an inspection contact structure having tapered contactors attached thereto.

Contactors for contact with the electrode pads U on the wafer W may be attached to tip portions of the conductive portions 30 of the second sheet 22 described in the above embodiment. In this case, for example, a plurality of contactors 80 in a tapered shape having a sharp tip are arranged to correspond to the conductive portions 30 as shown in FIG. 9 and held by a holder 81. The contactors 80 are made of, for example, a conductive metal. The holder 81 is formed in a flat plate shape and formed of an insulating material. The outer peripheral portion of the holder 81 is supported on the lower surface of the silicone substrate 20 by a supporting member 82, and top end surfaces of the contactors 80 abut the bottom surfaces of the conductive portions 30 in a pressed state. To inspect electric properties of the circuit on the wafer W, the electrode pads U on the wafer W are pressed against the tip portions of the contactors 80 so that the electrical signal from the circuit board 10 is supplied to the electrode pads U via the contactors 80. In this case, the contact pressure between the contactors 80 and the electrode pads U is large enough to ensure higher stability of the contact. Further, since the conductive portions 30 are not in direct contact with the electrode pads U, wear and breakage of the conductive portions 30 can be prevented.

Although one example of the embodiment of the present invention has been described, the present invention is not limited to this example but can take various forms. For example, any shape, number, and arrangement can be appropriately selected for the conductive portions 30 described in the above-described embodiment. The substrate constituting the inspection contact structure 12 is not limited to the silicone substrate but can be, for example, an organic substrate, a silicone dioxide substrate, a glass substrate, and the like which can be subjected to etching process. Further, the present invention is also applicable to a case where the object to be inspected is a substrate other than the wafer W, such as an FPD (Flat Panel Display), a mask reticule for photomask, or the like.

The present invention is useful for stably performing inspection of electric properties on portions to be inspected which are fine and provided at a narrow pitch.

What is claimed is:

1. A probe card for inspecting electric properties of an object to be inspected, said card comprising:

a circuit board; and an inspection contact structure provided between said circuit board and the object to be inspected, for passing current between the object to be inspected and said circuit board, said inspection contact structure comprising:

a substrate in a flat plate shape; and sheets respectively attached to both surfaces of the substrate, each of said sheets including a plurality of elastic conductive portions and insulating portions each interconnecting said conductive portions, said conductive portions being formed to pass through said sheet and protrude from both surfaces of said sheets, the substrate being formed with a plurality of current-carrying paths linearly passing through the substrate in a thickness direction in a manner to correspond to said conductive portions, said conductive portions of said sheets on both surfaces of the substrate being in contact with end portions of the respective corresponding current-carrying paths in a manner to have the current-carrying paths sandwiched therebetween, said sheets on both surfaces of the substrate being fixed to the substrate, and the substrate being fixed to the circuit board;

wherein said sheets are fixed to a frame formed along an outer peripheral portion of said sheets and fixed to the substrate via said frame; and wherein said frame is bond to the substrate with a silicone adhesive.

2. The probe card as set forth in claim 1, wherein said inspection contact structure is bonded to said circuit board with a silicone adhesive.

3. The probe card as set forth in claim 1, wherein said circuit board is formed with suction ports for sucking the substrate of said inspection contact structure.

4. The probe card as set forth in claim 1, wherein said inspection contact structure is freely attached to/detached from said circuit board.

5. The probe card as set forth in claim 1, wherein said inspection contact structure is freely attached to/detached from said circuit board by magnetic force.

6. The probe card as set forth in claim 1, wherein said conductive portions of said sheets on both surfaces of the substrate and the current-carrying paths in the substrate are arranged on the same axis.

7. The probe card as set forth in claim 1, wherein the substrate is a silicone substrate.

8. The probe card as set forth in claim 1, wherein the substrate is a glass substrate.

* * * * *